United States Patent
Zhou et al.

(10) Patent No.: US 10,178,817 B2
(45) Date of Patent: Jan. 8, 2019

(54) ELECTROMAGNETIC SHIELDING MATERIAL AND METHOD FOR PACKAGING OPTICAL MODULE

(71) Applicant: Huawei Technologies Co., Ltd., Shenzhen (CN)

(72) Inventors: Min Zhou, Shenzhen (CN); Huafeng Lin, Shenzhen (CN); Zhenxing Liao, Wuhan (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 179 days.

(21) Appl. No.: 15/420,972

(22) Filed: Jan. 31, 2017

(65) Prior Publication Data

US 2017/0142871 A1    May 18, 2017

Related U.S. Application Data

(63) Continuation of application No. PCT/CN2014/083516, filed on Aug. 1, 2014.

(51) Int. Cl.
  *H05K 9/00*    (2006.01)
  *G02B 6/42*    (2006.01)

(52) U.S. Cl.
  CPC ......... *H05K 9/0086* (2013.01); *G02B 6/4277* (2013.01); *H05K 9/00* (2013.01); *H05K 9/0058* (2013.01); *H05K 9/0088* (2013.01)

(58) Field of Classification Search
  CPC ...... G02B 6/4227; H05K 9/00; H05K 9/0058; H05K 9/0086; H05K 9/0088
  See application file for complete search history.

(56) References Cited

U.S. PATENT DOCUMENTS

| | | | | |
|---|---|---|---|---|
| 4,831,498 | A * | 5/1989 | Baba | H05K 9/0033 |
| | | | | 174/356 |
| 4,890,199 | A * | 12/1989 | Beutler | H04M 1/0202 |
| | | | | 361/818 |
| 4,973,963 | A | 11/1990 | Kurosawa et al. | |
| 5,354,951 | A * | 10/1994 | Lange, Sr. | H05K 9/0032 |
| | | | | 174/372 |
| 5,495,399 | A * | 2/1996 | Gore | H05K 9/0032 |
| | | | | 174/354 |
| 5,583,318 | A | 12/1996 | Powell | |
| 5,742,004 | A * | 4/1998 | Greco | H05K 9/0032 |
| | | | | 174/372 |
| 6,324,074 | B1 * | 11/2001 | Lunden | H04B 1/3827 |
| | | | | 174/377 |

(Continued)

FOREIGN PATENT DOCUMENTS

| | | |
|---|---|---|
| CN | 1722947 A | 1/2006 |
| CN | 1810069 A | 7/2006 |

(Continued)

*Primary Examiner* — Carl Arbes
(74) *Attorney, Agent, or Firm* — Slater Matsil, LLP

(57) ABSTRACT

Embodiments provide an electromagnetic shielding material and a method for packaging an optical module, where the electromagnetic shielding material includes an electromagnetic shield layer. The electromagnetic shield layer includes an external flux guide layer, an insulation medium layer, and an internal flux guide layer. The external flux guide layer is of a mesh structure, and each mesh forms a first guiding unit. The first guiding unit is of a tapered structure, and the guiding unit forms a first included angle with a horizontal direction. The first included angle is greater than 0 degrees and less than 90 degrees. A cross section of the electromagnetic shield layer is in a sawtooth shape.

15 Claims, 6 Drawing Sheets

(56) References Cited

U.S. PATENT DOCUMENTS

| | | | | |
|---|---|---|---|---|
| 6,624,432 | B1* | 9/2003 | Gabower | H04B 1/3838 |
| | | | | 174/384 |
| 7,504,592 | B1* | 3/2009 | Crotty, Jr. | H05K 9/0032 |
| | | | | 174/372 |
| 7,511,230 | B2* | 3/2009 | Cochrane | H05K 9/0015 |
| | | | | 174/382 |
| 7,910,839 | B2* | 3/2011 | Lynam | H05K 9/0009 |
| | | | | 174/369 |
| 7,995,355 | B2* | 8/2011 | Cochrane | H05K 9/0073 |
| | | | | 174/350 |
| 8,039,763 | B1* | 10/2011 | Cochrane | H05K 9/0009 |
| | | | | 174/377 |
| 8,111,526 | B2* | 2/2012 | Hsiung | H04N 9/3141 |
| | | | | 174/377 |
| 2006/0254814 | A1 | 11/2006 | Sze et al. | |
| 2009/0211801 | A1 | 8/2009 | Edwards et al. | |
| 2011/0083895 | A1* | 4/2011 | Cochrane | H05K 9/0015 |
| | | | | 174/384 |
| 2012/0049700 | A1* | 3/2012 | Cochrane | H05K 9/0049 |
| | | | | 312/223.2 |
| 2012/0236528 | A1 | 9/2012 | Le et al. | |
| 2016/0291272 | A1* | 10/2016 | Sun | G02B 6/4281 |

FOREIGN PATENT DOCUMENTS

| | | |
|---|---|---|
| CN | 103155737 A | 6/2013 |
| CN | 203072303 U | 7/2013 |
| EP | 2355644 A2 | 8/2011 |
| TW | 445836 U | 7/2001 |
| TW | 201419996 A | 5/2014 |

* cited by examiner

US 10,178,817 B2

ELECTROMAGNETIC SHIELDING MATERIAL AND METHOD FOR PACKAGING OPTICAL MODULE

CROSS-REFERENCE TO RELATED APPLICATIONS

This application is a continuation of International Application No. PCT/CN2014/083516, filed on Aug. 1, 2014, the disclosure of which is hereby incorporated by reference in its entirety.

TECHNICAL FIELD

Embodiments of the present invention relate to communications technologies, and in particular, to an electromagnetic shielding material and a method for packaging an optical module.

BACKGROUND

An optical sub-assembly is a main part in modern communications technologies, and is likely to fail due to electromagnetic interference from the outside. A conventional optical sub-assembly is generally packaged in a module, and electromagnetic shielding is performed by using a metal housing of the module.

However, with development of technologies and a requirement of costs reduction, currently, some optical sub-assemblies are directly disposed by means of welding on an external printed circuit board (PCB). Due to lack of shielding by a housing of a module, the optical sub-assemblies are subject to electromagnetic interference from the outside of the sub-assemblies. Therefore, a technical problem of "external electromagnetic shielding of an optical sub-assembly" is to be resolved.

In addition, electromagnetic crosstalk always exists between optical components inside an optical sub-assembly, and crosstalk between a transmitter (Tx for short) and a receiver (Rx for short) in a bi-directional optical sub-assembly (BOSA for short) is the most common. The crosstalk includes optical crosstalk and electrical crosstalk. Therefore, a technical problem of "internal electromagnetic shielding of an optical sub-assembly" is to be resolved.

Currently, a main solution in the industry is using a metal shielding case, as shown in FIG. 1. A packaging area and jacks are disposed around a BOSA, and the metal case has pins. The pins are inserted into the jacks on a printed circuit board (PCB for short) during packaging, and are fastened by means of welding. The metal housing needs to be grounded. To prevent electromagnetic leakage, the metal case needs to be firmly welded to be tightly close to supporting parts surrounding the optical sub-assembly, so as to ensure that no crack exists in an exterior of the optical sub-assembly and prevent the electromagnetic leakage. However, the solution has the following disadvantages:

1. An external electromagnetic shielding part of the optical sub-assembly is difficult to disassemble and assemble, and to return for repair.

In a case in which a requirement of shielding performance is strict, welded pins are densely arranged on the metal case. Sometimes, to ensure tight welding, airtight welding needs to be further performed on a seam, which causes a worker to spend a long time in welding and costs a lot. In addition, airtight welding relies heavily on skills of a worker. Effects of welding by different workers or even by a same worker in different time are different. Therefore, there are great risks in welding yield and performance.

Therefore, to prevent electromagnetic leakage, the metal case is difficult to "assemble", and difficult "assembly" means more difficult "disassemble". For a metal case that has dense welding joints or on which airtight welding is performed, it is undoubtedly time-consuming and laborious to dismantle the metal case. Existing production experience indicates that such disassembly usually damages the internal optical sub-assembly. However, when the optical sub-assembly is returned for repair, the shielding case needs to be disassembled. Therefore, conventional electromagnetic shielding of the optical sub-assembly implemented by using a metal shielding case is particularly unfavorable to return for repair of the optical sub-assembly.

2. An internal electromagnetic shielding part of the optical sub-assembly is difficult to package and miniaturize.

For the technical problem of "external electromagnetic shielding of an optical sub-assembly", there is no satisfactory solution in the industry currently. Main solutions are making Rx and Tx signal cables far from each other, using a small metal case for shielding, and the like. All these measures require the optical sub-assembly to have a large enough volume to provide a distance between the signal cables and place the small metal case. Therefore, it is difficult to implement miniaturization of the optical sub-assembly. In addition, packaging a metal case inside a component is rather difficult in techniques because welding is needed.

3. An electromagnetic shielding part of the optical sub-assembly needs to be grounded.

Grounding processing is needed in all existing solutions in the industry in which a metal shielding case is used. For the grounding processing, a ground terminal needs to be specially arranged, which causes difficulties in designing and manufacturing a component and a board, and the component and the board can hardly be used universally or standardized. Because a ground is public, disassembly and assembly affect performance of another component.

SUMMARY

Embodiments of the present invention provide an electromagnetic shielding material and a method for packaging an optical module, so as to resolve prior-art technical problems caused by use of a metal shielding case, where the problems include difficulties in disassembly and assemble, return for repair, and miniaturization, low packaging efficiency, and a need for grounding.

According to a first aspect, an electromagnetic shielding material is provided, including an electromagnetic shield layer, where the electromagnetic shield layer includes an external flux guide layer, an insulation medium layer, and an internal flux guide layer, and both the external flux guide layer and the internal flux guide layer are conductors with an electromagnetic self-induction capability. The external flux guide layer is of a mesh structure, each mesh forms a first guiding unit, the first guiding unit is of a tapered structure, and the guiding unit forms a first included angle with a horizontal direction, where the first included angle is greater than 0 degrees and less than 90 degrees. The internal flux guide layer is of a mesh structure, each mesh forms a second guiding unit, the second guiding unit is of a tapered structure, and the second guiding unit forms a second included angle with a horizontal direction. The second included angle is greater than 0 degrees and less than 90 degrees. Both the external flux guide layer and the internal flux guide layer are in a sawtooth shape.

With reference to the first aspect, in a first possible implementation manner of the first aspect, the first included angle is equal to the second included angle.

With reference to the first aspect, or the first possible implementation manner of the first aspect, in a second possible implementation manner of the first aspect, the tapered structure of the first guiding unit presents a tip-end downwards and a round-end upwards, and the tapered structure of the second guiding unit presents a tip-end upwards and a round-end downwards.

With reference to any one of the first aspect or the possible implementation manners of the first aspect, in a third possible implementation manner of the first aspect, a self-induction coefficient of the internal flux guide layer is greater than a self-induction coefficient of the external flux guide layer.

With reference to any one of the first aspect or the possible implementation manners of the first aspect, in a fourth possible implementation manner of the first aspect, the internal flux guide layer is made of nickel or cobalt.

With reference to any one of the first aspect or the possible implementation manners of the first aspect, in a fifth possible implementation manner of the first aspect, the external flux guide layer is made of copper or silver.

With reference to any one of the first aspect or the possible implementation manners of the first aspect, in a sixth possible implementation manner of the first aspect, the insulation medium layer includes a thermal-conductive particle.

With reference to any one of the first aspect or the possible implementation manners of the first aspect, in a sixth possible implementation manner of the first aspect, the electromagnetic shielding material further includes a protective layer, and the protective layer is configured to provide outer physical protection.

With reference to any one of the first aspect or the possible implementation manners of the first aspect, in a seventh possible implementation manner of the first aspect, the electromagnetic shielding material further includes a bottom layer, and the bottom layer is an insulative thermal-conductive adhesive layer.

According to a second aspect, a method for packaging an optical module is provided. The method includes packaging the optical module by using a membrane made of an electromagnetic shielding material, and sticking the membrane onto a board of the optical module, where the electromagnetic shielding material is the electromagnetic shielding material according to any one of the first aspect.

With reference to the second aspect, in a first possible implementation manner of the second aspect, a hole is disposed on the membrane, and the hole is used to stretch out a pigtail of the optical module.

With reference to the second aspect or the first possible implementation manner of the second aspect, in a second possible implementation manner of the second aspect, the method further includes: performing sealing shielding on a crack at an outlet of the pigtail by using a conductive adhesive.

With reference to any one of the second aspect or the possible implementation manners of the second aspect, in a third possible implementation manner of the second aspect, a wedge frame is disposed on the optical module, and the wedge frame provides a protruding tilt angle, configured to be attached to by the membrane made of the electromagnetic shielding material.

With reference to the third possible implementation manner of the second aspect, in a fourth possible implementation manner, the frame is a plastic frame.

With reference to the third possible implementation manner or the fourth possible implementation manner of the second aspect, in a fifth possible implementation manner, the protruding tilt angle is 3-5 millimeters high.

The following technical effects can be achieved by using the technical solutions of the present invention:

1. Grounding is not required, and a ground point does not need to be disposed around an optical sub-assembly. Adhesive packaging is implemented, and disassembly and assembly, and return for repair are convenient.

2. The electromagnetic shielding material provided in the present invention is a soft material. Only a positioning frame needs to be reserved around the optical sub-assembly, and unlike a metal shielding case, the electromagnetic shielding material does not need accurate jack positioning. Therefore, mounting efficiency is high, and labor costs are low.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DETAILED DESCRIPTION OF ILLUSTRATIVE EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

In the embodiments of the present invention, a material based on a self-cancellation electromagnetic shielding technology is used as a main part for anti-electromagnetic crosstalk. The material has a soft composite film structure, and fully wraps, by means of sticking, an optical sub-assembly requiring anti-crosstalk protection. The film structure is soft and may be freely transformed to adapt to multiple application scenarios of optical sub-assemblies whose specifications are different. An internal structure designed can generate a self-cancellation electromagnetic shielding effect, and a shielding part does not need to be grounded and can be used in any area of a board or a system without a ground point welded. Different from a conventional exposed metal structure, a shielding structure is characterized by mechanical scratch resistance, chemical corrosion resistance, and oxidation resistance, and therefore can be applied to various environmental conditions.

Figure 1:
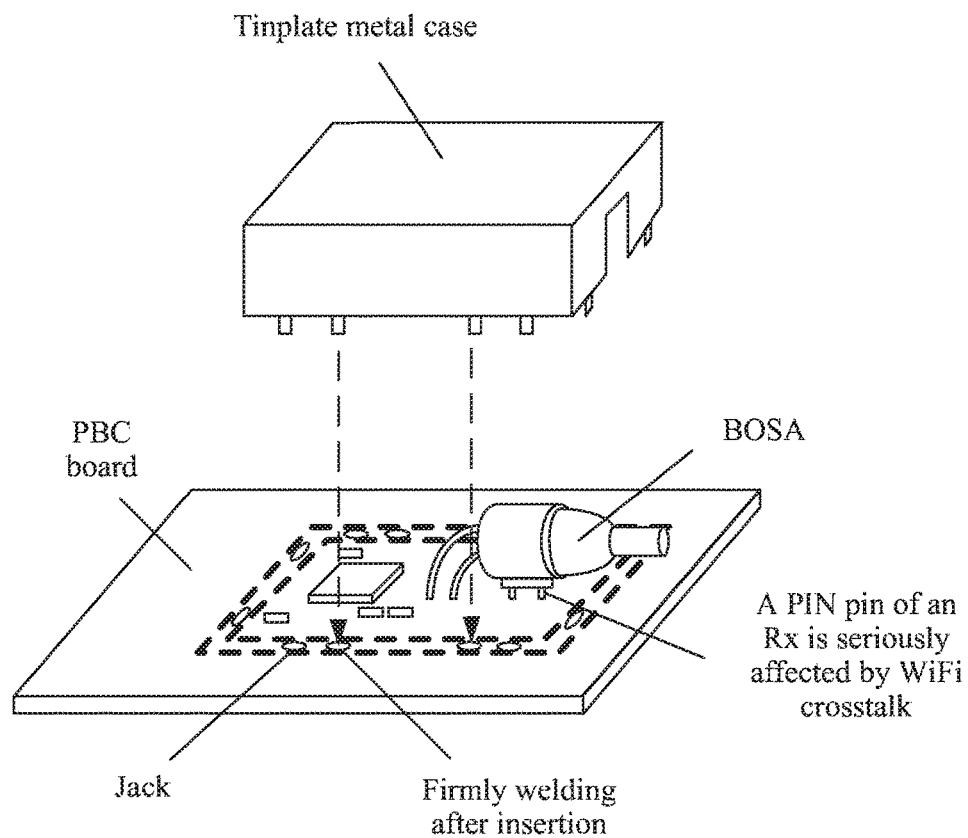
FIG. 1 is a schematic structural diagram of electromagnetic shielding of a conventional BOSA in the prior art.
Figure 2:
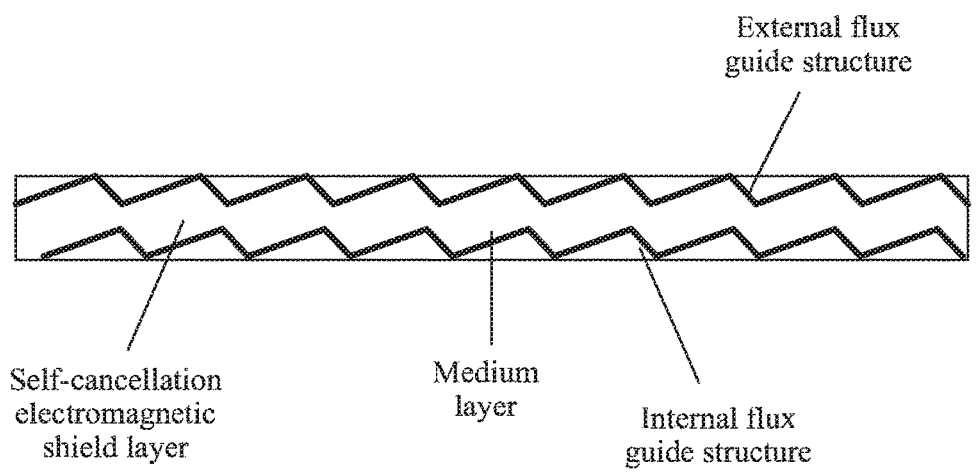
FIG. 2 is a schematic structural diagram of an electromagnetic shielding material according to an embodiment of the present invention.

As shown in FIG. 2, an electromagnetic shielding material provided in the embodiments of the present invention includes an electromagnetic shield layer. The electromagnetic shield layer includes upper and lower layers of flux guide structures and an insulation medium layer. The upper and lower layers of flux guide structures may be respectively referred to as an external flux guide structure and an internal flux guide structure. The two layers of flux guide structures are separated by an insulation medium that is used as a physical support. Both the two layers of flux guide structures are conductors with an electromagnetic self-induction capability, such as a metal material, or another material with an electromagnetic self-induction capability. When the electromagnetic shielding material is looked over, the external flux guide layer is of a mesh structure, and each mesh forms a first guiding unit. The first guiding unit is of a tapered structure, and the first guiding unit forms a first included angle with a horizontal direction, where the first included angle is greater than 0 degrees and less than 90 degrees. When the electromagnetic shield layer is viewed from a side, the external flux guide layer and the internal flux guide layer are parallel to each other, and in a sawtooth shape. The two layers of flux guide structures can form two layers of reverse fluxes based on an induced eddy current form, so as to cancel an induced electromagnetic field caused by shielding. This self-cancellation shielding manner makes a shielding enclosure not need to be grounded.

Figure 3:
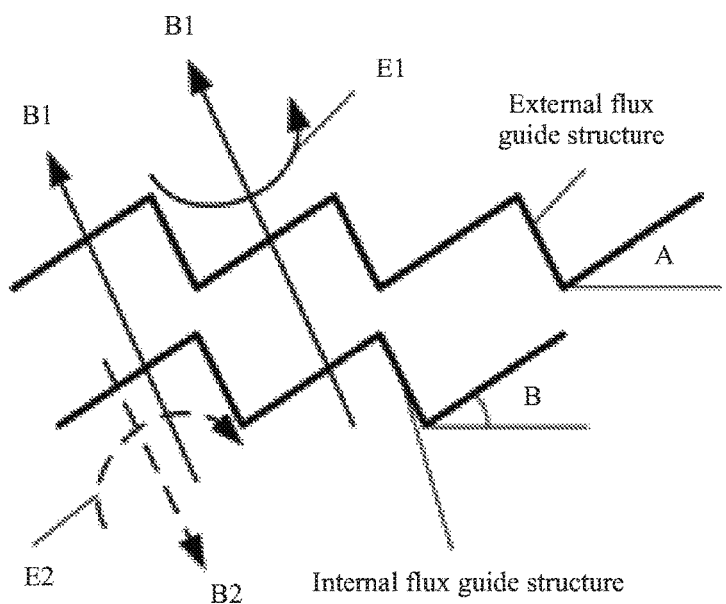
FIG. 3 is a side view of a structure of an electromagnetic shielding material according to an embodiment of the present invention.

Specifically, FIG. 3 is a side view of an internal structure of a self-cancellation shield layer, and discloses a specific embodiment of the foregoing two layers of flux structures. As shown in FIG. 3, an upper layer is an external flux guide layer, and a lower layer is an internal flux guide layer. When the electromagnetic shield layer is looked over, the external flux guide layer is of a mesh structure, and each mesh forms a guiding unit (not shown in FIG. 3), which is referred to as a first guiding unit. The guiding unit is of a tapered structure, as a tapered unit shown in FIG. 4. The first guiding unit forms an included angle A with a horizontal direction, where a range of the include angle may be: 0 degrees<A<90 degrees.

When the electromagnetic shield layer is looked up, the internal flux guide layer is of a mesh structure, and each mesh forms a second guiding unit. The second guiding unit is of a tapered structure, and the second guiding unit forms a second included angle B with a horizontal direction, where the second included angle B is greater than 0 degrees and less than 90 degrees.

When the included angles A and B of the upper and lower layers of guiding units are equal, an electromagnetic self-cancellation effect is optimal. Side views of the two guide layers are in horizontally parallel arrangement, and cross sections of the two guide layers are in folding arrangement and in a sawtooth shape, as shown in FIG. 2 and FIG. 3.

Figure 4:
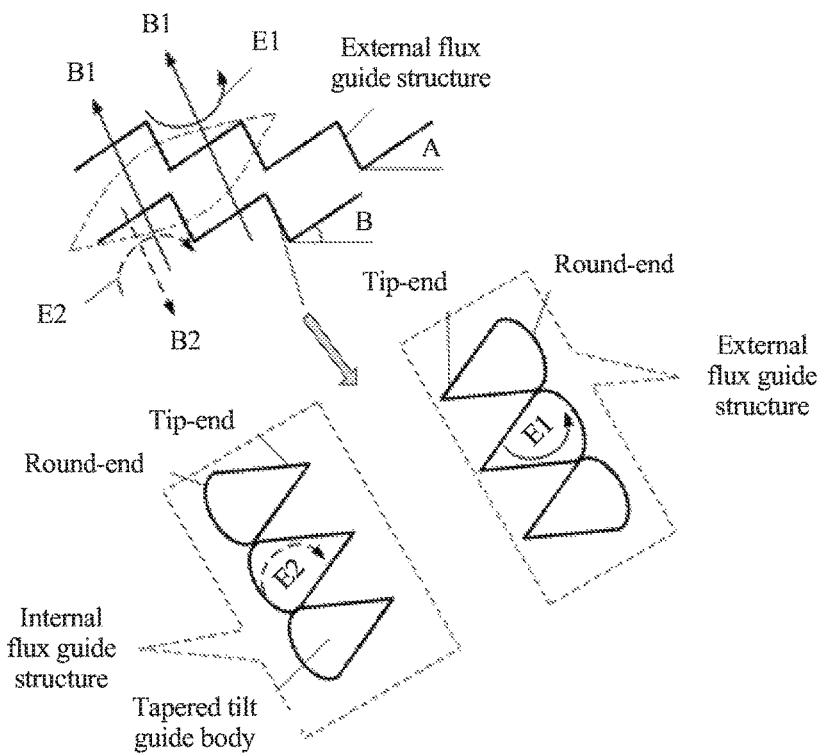
FIG. 4 is a schematic diagram of a flux self-cancellation principle of an electromagnetic shielding material according to an embodiment of the present invention.

As shown in FIG. 4, each second guiding unit of the external flux guide layer corresponds to one first guiding unit that is of the internal flux guide layer and that is parallel to the second guiding unit. The first guiding unit and the second guiding unit are not shown in FIG. 2 and FIG. 3. For ease of understanding, a part circled with a dashed line in FIG. 4 includes a first guiding unit of the external flux guide structure and a second guiding unit of the internal flux guide structure. Side views of the first guiding unit of the external flux guide structure and the second guiding unit of the internal flux guide structure are two parallel planes. Top views of the first guiding unit of the external flux guide structure and the second guiding unit of the internal flux guide structure are diagrams pointed to by an arrow in FIG. 4, which are two tapered units whose tip-ends are opposite to each other. When there is external electromagnetic crosstalk, a guiding unit in the external flux guide structure generates a counterclockwise eddy current E1, and generates a primary induced flux B1. Because the upper and lower layers of guiding units are parallel, the induced flux B1 of the upper layer guiding unit vertically crosses an internal flux guiding unit corresponding to the upper layer guiding unit. Based on the law of electromagnetic induction, the lower layer guiding unit generates a secondary induced flux B2 that is in a direction opposite to B1 and is used to hinder a flux change of the lower layer guiding unit. Accordingly, the internal flux guiding unit generates a clockwise eddy current E2 because of the electromagnetic induction. Limited by a structure of two guide layers, the two eddy currents E1 and E2 form a parallel and reverse pattern, and the two fluxes B1 and B2 are just in opposite directions.

FIG. 4 shows grid-shaped guiding units in a flux guide structure, where each unit is in a tapered shape. These tapered units are arranged in tilt angles. An upper tilt angle and a lower tilt angle are the same, and all units are parallel on a plane. The tapered unit has an obvious tip-end and a round-end. For the upper layer guiding unit, the tip-end is downward, and the round-end is upward; and for the lower layer guiding unit, the tip-end is upward, and the round-end is downward. Because of a tip-end effect, more induced charges of the guiding unit accumulate at the tip-end, and less induced charges accumulate at the round-end. When an induced eddy current is being formed, the tip-ends of the upper and lower layer guiding units are close to each other, and the charges rapidly reversely gyrate because of strong repulsion. A strong reverse eddy current is formed under traction of an initial induced eddy current, and further flux self-cancellation strength is enhanced.

Because the external flux guide structure is the primary induced flux, and the internal flux guide structure is the secondary induced flux, in design, a self-induction coefficient selected for an internal flux conductor needs to be greater than that of an external flux conductor, so as to enable the two reverse fluxes to cancel each other as much as possible. For example, a material such as copper or silver may be selected as a material of the external flux conductor, and a material such as nickel or cobalt may be selected as a material of the internal flux conductor.

Optionally, the insulation medium layer between the two flux guide layers has anti-oxidative and thermal-conductive performance, which can isolate moisture, oxygen, and the like, so as to prevent the electromagnetic shield layer from being oxidized.

Optionally, processing of resistance to acid and alkali corrosion needs to be performed on the insulation medium layer, and chemical isolation is performed on the material. In addition, a thermal-conductive particle may be further added into the insulation medium layer, so as to improve heat-dissipation performance of the material.

Figure 5:
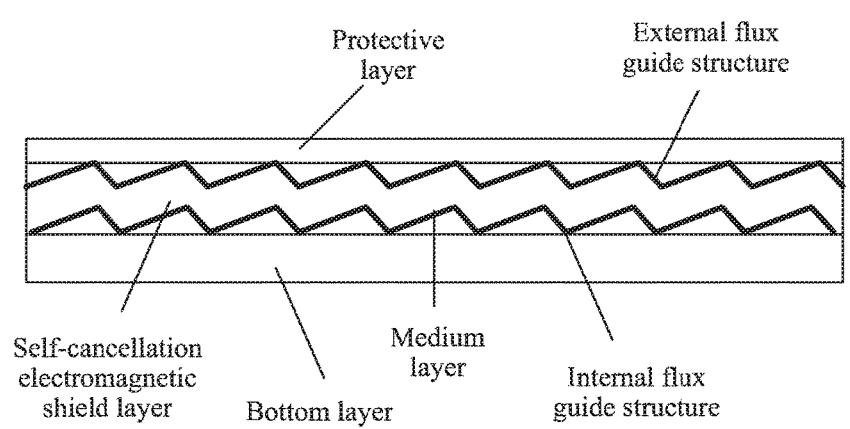
FIG. 5 is a schematic structural diagram of another electromagnetic shielding material according to an embodiment of the present invention.

Optionally, as shown in FIG. 5, the electromagnetic shielding material may further include a protective layer, located on an upper layer of the foregoing electromagnetic shield layer. The protective layer is mainly configured to provide outer physical protection to resist mechanical stress and prevent damage to the material caused by external mechanical cutting and scratching, or the like. For example, the protective layer may be an organic polymer, a dense oxide, or the like.

Optionally, the electromagnetic shielding material may further include a bottom layer, located on a lower layer of the foregoing electromagnetic shield layer. The bottom layer is an insulative thermal-conductive adhesive layer, features low thermal resistance, and is configured to rapidly guide heat on a surface of an attached object to a heat-dissipation medium such as a PCB board. The insulative thermal-conductive adhesive layer is further configured to cut off an electrical connection of pins between components, so as to prevent a short-circuit that occurs during sticking. The insulative thermal-conductive adhesive layer is further configured to stick the shielding material to an edge of a BOSA, so as to implement fully-closed electromagnetic shielding without leakage. A prior-art material used for thermal conductivity and insulation may be selected for the insulative thermal-conductive adhesive layer, which is not limited in the present invention.

Anti-electromagnetic crosstalk of an optical sub-assembly is implemented by using the self-cancellation electromagnetic shielding material disclosed in this embodiment of the present invention. During packaging a component, the packaging needs to be easy and efficient, the component needs to be easy to disassemble and assemble, and performance of the component needs to be stable and reliable without being affected by the packaging. The following uses three specific embodiments to describe packaging, by using this material, a sub-assembly to prevent the sub-assembly from being affected by electromagnetic interference.

Figure 6:
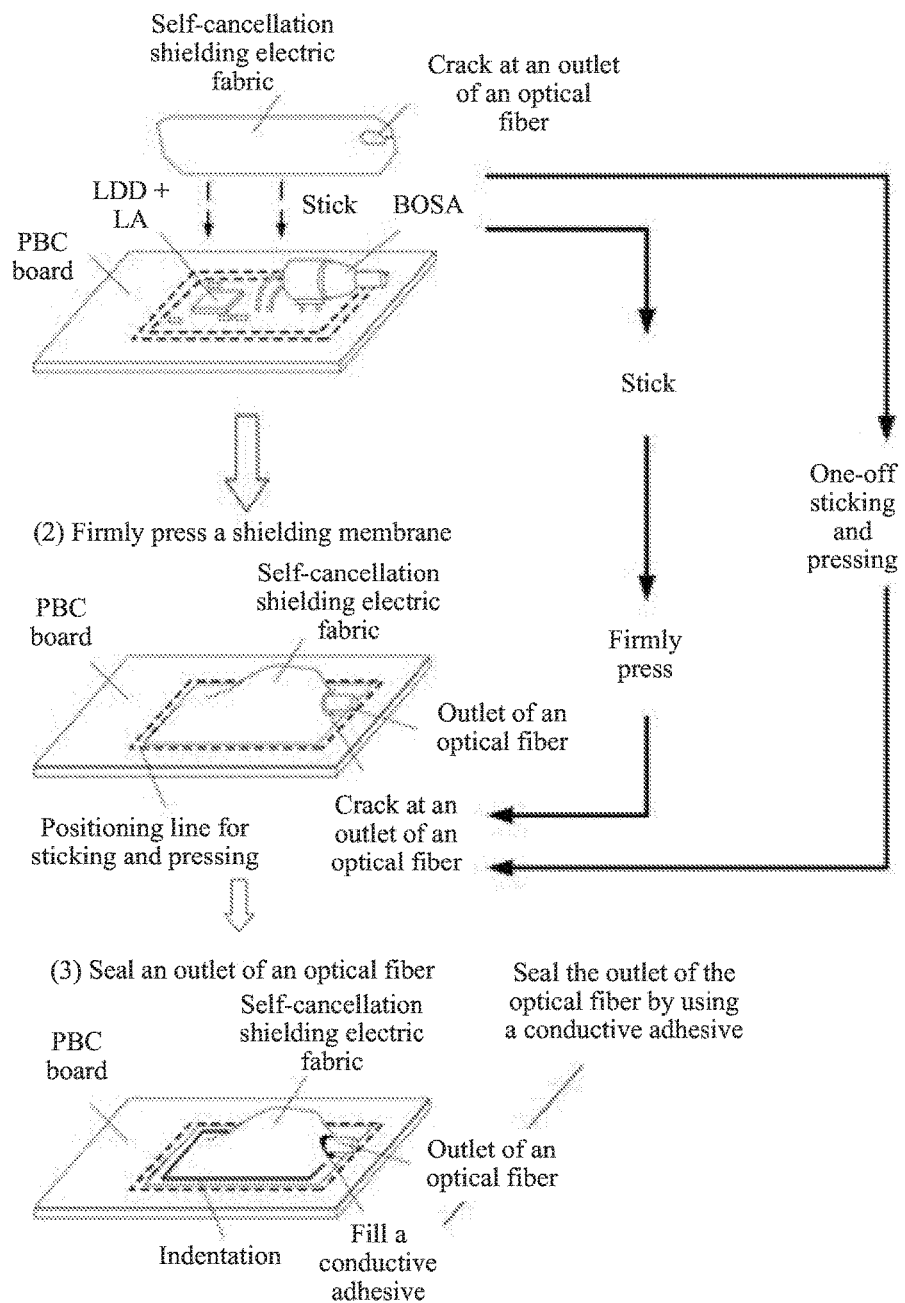
FIG. 6 is a schematic flowchart of performing direct adhesive packaging on a BOSA according to the present invention.

As shown in FIG. 6, the material in the present invention is directly stuck around a component requiring electromagnetic shielding. Using an optical assembly BOSA as an example, packaging steps are as follows.

1. Prepare a self-cancellation electromagnetic shielding material membrane, and open a small hole at a front end of the membrane, which is convenient for stretching out a pigtail of the BOSA.

2. A sticking area is disposed around the BOSA on a board, and a positioning dashed line is marked around the area. Referring to the positioning dashed line, stick the self-cancellation electromagnetic shielding material membrane to the sticking area and wrap the BOSA. An edge of the self-cancellation electromagnetic shielding material membrane is aligned with the positioning dashed line. The pigtail of the BOSA stretches out through the opening at the front end of the membrane.

3. After the self-cancellation electromagnetic shielding membrane is stuck, firmly press the edge of the membrane along the positioning dashed line, so as to prevent electromagnetic leakage.

4. Perform sealing shielding on a crack at an outlet of the pigtail by using a conductive adhesive.

Compared with shielding using a metal case, shielding using the self-cancellation electromagnetic shielding material does not need grounding. Precision requirements of a membrane size and sticking positioning are quite low, and tolerance may be up to several millimeters. Therefore, the foregoing sticking and pressing procedures may be easily operated by hand totally, without needing another device (while welding needs a corresponding tool and a power supply, and has a risk of causing fire, scalds, or the like). In addition, one-off sticking and pressing using a machine in a pipeline may also be used to improve production efficiency. Because of a low precision requirement of the operation, corresponding device costs are quite low.

In this solution, a self-absorption bond is used for sticking, which can further make up for some electromagnetic leakage caused by insecure pressing, so that packaging yield is enhanced. If electro-welding is used, and once electromagnetic leakage is caused by an inappropriate operation, only repair welding or even re-welding can be performed to resolve the electromagnetic leakage problem, thereby wasting labor and time.

Due to existence of the BOSA pigtail, a crack is left on the self-cancellation electromagnetic shielding membrane. The self-cancellation electromagnetic shielding membrane is a soft shielding material, and the opening at the front end may be designed to match a size of the pigtail. The crack on the membrane is less than 1 mm, and is much less than an opening of the metal case made of a hard material. An investigation on an existing technical application shows that, a pigtail opening on the metal shielding case of the BOSA does not affect a shielding effect. Therefore, theoretically, a crack on the self-cancellation electromagnetic shielding membrane does not affect the shielding effect either. The performing sealing by using a conductive adhesive in step 4 is an optional step.

Figure 7:
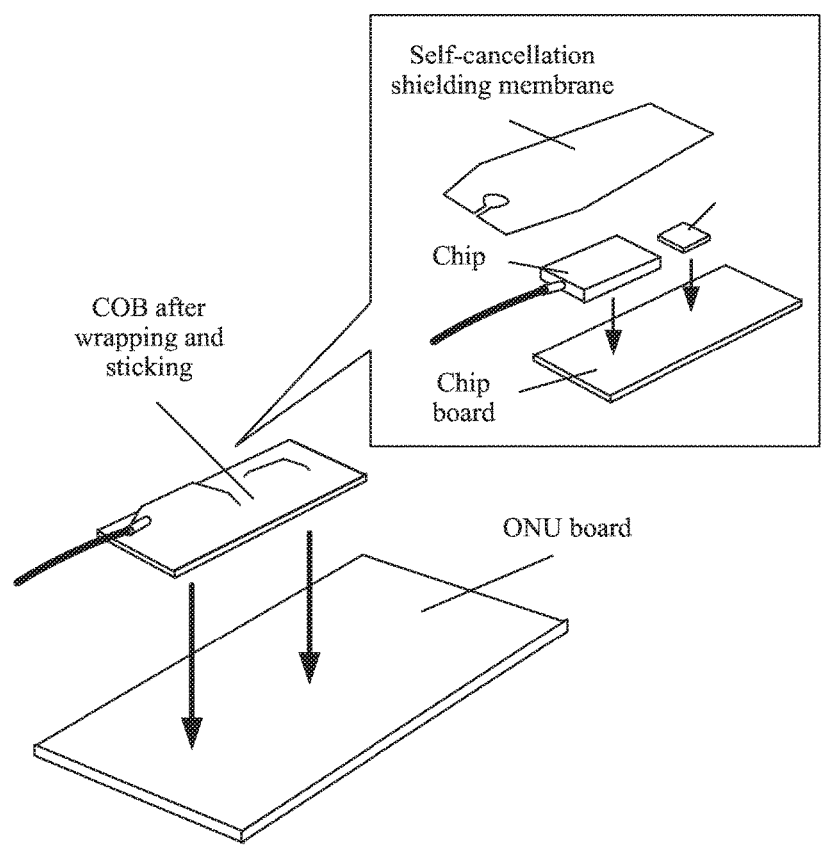
FIG. 7 is a schematic diagram of a packaging manner in full-wrapping mode according to an embodiment of the present invention.

As shown in FIG. 7, another possible implementation manner is chip on board (COB for short), that is, a chip is disposed on a board. The chip and the board are bridged by using a small board (chip board). A laser detector diode (LDD for short), a laser amplifier (LA for short), and a matched resistor-capacitor are disposed on the small board. Therefore, the self-cancellation shielding membrane may cover the whole board and edges of the chip board in full-wrapping mode, and then the small board is disposed on a big board by means of insertion. The COB manner may implement shielding with edges fully wrapped, and electromagnetic leakage is the lowest.

Figure 8:
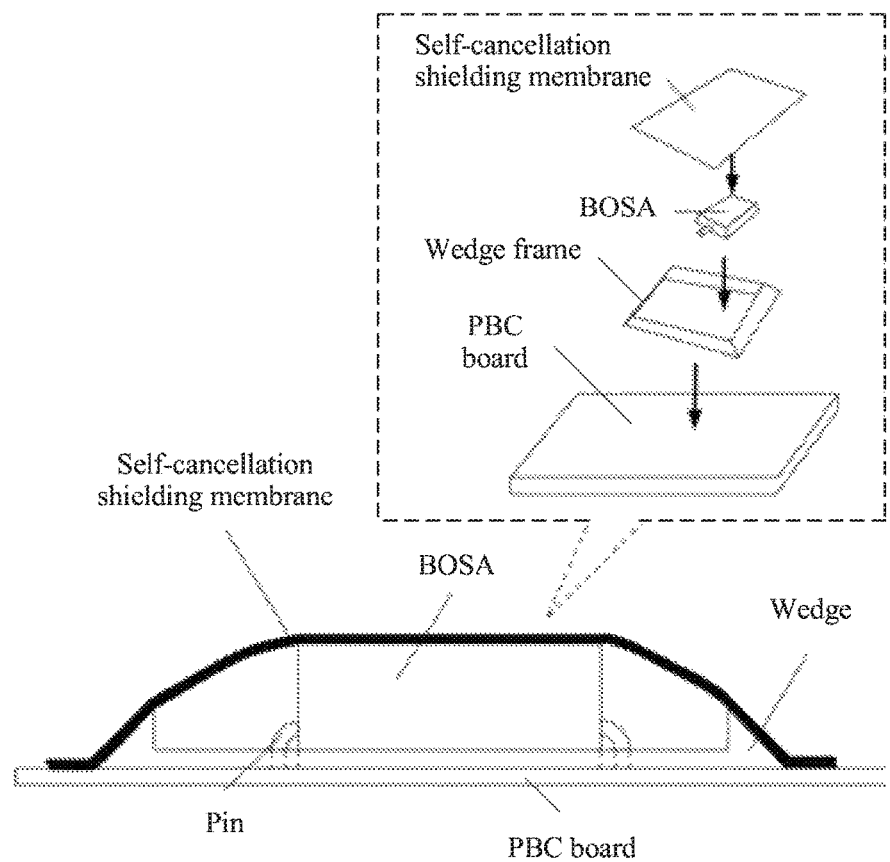
FIG. 8 is a schematic diagram of a wedge edge-sealing manner according to an embodiment of the present invention.

FIG. 8 is a third possible implementation manner. As described in the foregoing two embodiments, the self-cancellation electromagnetic shielding membrane is flatly stuck. Because the BOSA protrudes from the PBC board to a specific height, a wedge plastic frame is considered to be disposed around the BOSA to facilitate sticking. The plastic frame provides a protruding tilt angle about 3-5 millimeters high, configured to be attached to by the self-cancellation shielding membrane.

The following technical effects can be achieved by using the technical solutions of the embodiments of the present invention.

1. Grounding is not required, and a ground point does not need to be disposed around an optical sub-assembly. Adhesive packaging is implemented, and disassembly and assembly, and return for repair are convenient.

2. The electromagnetic shielding material provided in the embodiments of the present invention is a soft material.

Only a positioning frame needs to be reserved around the optical sub-assembly for sticking, or a component requiring shielding is fully wrapped directly in a COB form, and unlike a metal shielding case, the electromagnetic shielding material does not need accurate jack positioning. Therefore, a mounting efficiency is high, and labor costs are low.

Finally, it should be noted that the foregoing embodiments are merely intended to describe the technical solutions of the present invention, but not to limit the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof. Therefore, the protection scope of the present invention shall be subject to the protection scope of the claims.

What is claimed is:

1. An electromagnetic shielding material, comprising an electromagnetic shield layer, wherein the electromagnetic shield layer comprises:
    an external flux guide layer;
    an insulation medium layer; and
    an internal flux guide layer, wherein both the external flux guide layer and the internal flux guide layer are conductors with an electromagnetic self-induction capability;
    wherein the external flux guide layer is of a mesh structure, each mesh of the mesh structure of the external flux guide layer forms a first guiding unit, the first guiding unit is of a tapered structure, and the first guiding unit forms a first included angle with a horizontal direction, wherein the first included angle is greater than 0 degrees and less than 90 degrees;
    wherein the internal flux guide layer is of a mesh structure, each mesh of the mesh structure of the internal flux guide layer forms a second guiding unit, the second guiding unit is of a tapered structure, and the second guiding unit forms a second included angle with a horizontal direction, wherein the second included angle is greater than 0 degrees and less than 90 degrees; and
    wherein both the external flux guide layer and the internal flux guide layer are in a sawtooth shape.

2. The electromagnetic shielding material according to claim 1, wherein the first included angle is equal to the second included angle.

3. The electromagnetic shielding material according to claim 1, wherein the tapered structure of the first guiding unit presents a tip-end downwards and a round-end upwards, and the tapered structure of the second guiding unit presents a tip-end upwards and a round-end downwards.

4. The electromagnetic shielding material according to claim 1, wherein a self-induction coefficient of the internal flux guide layer is greater than a self-induction coefficient of the external flux guide layer.

5. The electromagnetic shielding material according to claim 1, wherein the internal flux guide layer is made of nickel or cobalt.

6. The electromagnetic shielding material according to claim 1, wherein the external flux guide layer is made of copper or silver.

7. The electromagnetic shielding material according to claim 1, wherein the insulation medium layer comprises a thermal-conductive particle.

8. The electromagnetic shielding material according to claim 1, wherein the electromagnetic shielding material further comprises a protective layer, and the protective layer is configured to provide outer physical protection.

9. The electromagnetic shielding material according to claim 1, wherein the electromagnetic shielding material further comprises a bottom layer, and the bottom layer is an insulative thermal-conductive adhesive layer.

10. A method, comprising:
    wrapping an optical module in a membrane made of an electromagnetic shielding material, and sticking the membrane onto a board of the optical module;
    wherein the electromagnetic shielding material comprises an electromagnetic shield layer, wherein the electromagnetic shield layer comprises:
    an external flux guide layer;
    an insulation medium layer; and
    an internal flux guide layer, wherein both the external flux guide layer and the internal flux guide layer are conductors with an electromagnetic self-induction capability;
    wherein the external flux guide layer is of a mesh structure, each mesh of the mesh structure of the external flux guide layer forms a first guiding unit, the first guiding unit is of a tapered structure, and the first guiding unit forms a first included angle with a horizontal direction, wherein the first included angle is greater than 0 degrees and less than 90 degrees; and
    the internal flux guide layer is of a mesh structure, each mesh of the mesh structure of the internal flux guide layer forms a second guiding unit, the second guiding unit is of a tapered structure, and the second guiding unit forms a second included angle with a horizontal direction, wherein the second included angle is greater than 0 degrees and less than 90 degrees; and
    wherein both the external flux guide layer and the internal flux guide layer are in a sawtooth shape.

11. The method according to claim 10, wherein a hole is disposed on the membrane, and the hole is used to stretch out a pigtail of the optical module.

12. The method according to claim 10, wherein the method further comprises:
    performing sealing shielding on a crack at an outlet of the pigtail by using a conductive adhesive.

13. The method according to claim 10, wherein a wedge frame is disposed on the optical module, and the wedge frame provides a protruding tilt angle, configured to be attached to by the membrane made of the electromagnetic shielding material.

14. The method according to claim 13, wherein the frame is a plastic frame.

15. The method according to claim 13, wherein the protruding tilt angle is 3-5 millimeters high.

* * * * *